United States Patent
Callicoat et al.

(10) Patent No.: US 9,741,991 B2
(45) Date of Patent: Aug. 22, 2017

(54) INTEGRATED VOLTAGE SENSE AND BUS BAR SYSTEM AND METHOD FOR VEHICLES HAVING A TRACTION BATTERY

(71) Applicant: FORD GLOBAL TECHNOLOGIES, LLC, Dearborn, MI (US)

(72) Inventors: Debbi Callicoat, Livonia, MI (US); Raymond C. Siciak, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 707 days.

(21) Appl. No.: 14/179,495

(22) Filed: Feb. 12, 2014

(65) Prior Publication Data
US 2015/0224892 A1 Aug. 13, 2015

(51) Int. Cl.
| | |
|---|---|
| *H01M 2/20* | (2006.01) |
| *G01R 1/04* | (2006.01) |
| *B23K 31/02* | (2006.01) |
| *B60L 11/18* | (2006.01) |
| *H01M 2/10* | (2006.01) |
| *H01M 2/24* | (2006.01) |
| *H01M 10/48* | (2006.01) |

(52) U.S. Cl.
CPC ............ *H01M 2/206* (2013.01); *B23K 31/02* (2013.01); *B60L 11/1861* (2013.01); *B60L 11/1877* (2013.01); *G01R 1/0416* (2013.01); *H01M 2/1077* (2013.01); *H01M 2/1083* (2013.01); *H01M 2/24* (2013.01); *H01M 10/482* (2013.01); *H01M 2220/20* (2013.01); *Y10T 29/49174* (2015.01); *Y10T 29/49185* (2015.01)

(58) Field of Classification Search
CPC .. H01M 2/206; H01M 2/1077; H01M 10/482; G01R 1/0416
USPC .......................................................... 429/90
See application file for complete search history.

(56) References Cited

U.S. PATENT DOCUMENTS

| | | | |
|---|---|---|---|
| 5,013,948 A | * | 5/1991 | Tumpey .................... C03C 8/02 257/909 |
| 7,229,320 B2 | | 6/2007 | Saito et al. |
| 2009/0325042 A1 | | 12/2009 | Koetting et al. |
| 2011/0204879 A1 | | 8/2011 | Peretto |

* cited by examiner

*Primary Examiner* — Basia Ridley
*Assistant Examiner* — James Erwin
(74) *Attorney, Agent, or Firm* — David B. Kelley; Brooks Kushman P.C.

(57) ABSTRACT

A vehicle includes a traction battery having a plurality of battery cells positioned in an array with a non-conductive bus bar housing having a plurality of compartments insulated from one another and containing one or more bus bars each having an integrally formed voltage sense connector. Each compartment may accommodate terminals of a pair of adjacent battery cells to be coupled by the associated bus bar. The voltage sense connector may include fingers for crimping and securing a voltage sense wire or a welding pad for welding, soldering, or similar connection. The voltage sense wires connect to a battery control module.

4 Claims, 5 Drawing Sheets

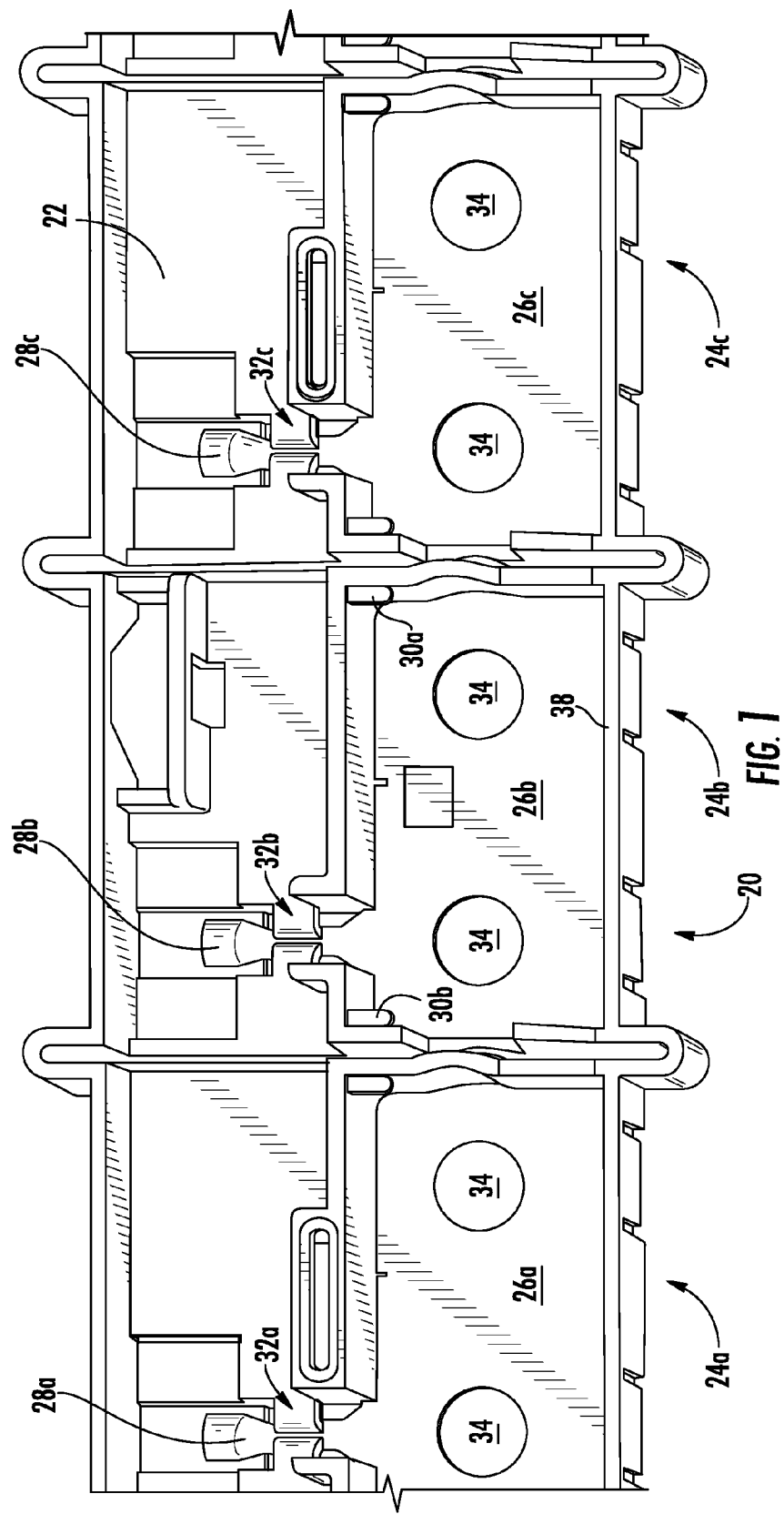

INTEGRATED VOLTAGE SENSE AND BUS BAR SYSTEM AND METHOD FOR VEHICLES HAVING A TRACTION BATTERY

TECHNICAL FIELD

The present disclosure relates to integration of voltage sensing and battery cell connection by bus bars for a vehicle having a traction battery.

BACKGROUND

Hybrid and electric vehicles include high voltage battery packs that provide power to a fraction motor to propel the vehicle when operating in an electric mode. The traction battery may also be used to power various vehicle systems and components, such as power steering and electrical accessories, for example. The traction battery contains one or more arrays of battery cells that are interconnected to reach a desired voltage to meet the energy demands of the vehicle. Bus bars are used to connect the battery cells together. For instance, to connect a pair of cells, the terminals of the pair of cells are attached to a bus bar secured with corresponding fasteners or welded in place. The voltages of the battery cells are monitored by an associated battery control module that balances the charge for each cell or pair of cells and controls battery charging, discharging, and conditioning in cooperation with a vehicle system controller. Various applications include a separate and independent voltage sensor or sensing lead/wire connected to each battery cell or pair of cells so that the battery control module can control and balance the charge for each cell or cell pair. The cell voltage sensing leads are secured to the terminal post by an associated nut or other fastener.

SUMMARY

Embodiments according to the present disclosure include a vehicle having a traction battery with a plurality of traction battery cells electrically connected by a plurality of bus bars having integrally formed voltage sensor connectors. The voltage sensor connectors have a voltage sensing lead that connects a voltage sensing wire for connection to a battery control module. The bus bars with integrated voltage sensor connectors may have a flat surface for welding to the electrical contact of the adjacent battery cells of the associated traction battery cell pair. Embodiments include bus bar voltage sensor connectors having two holes that cooperate with the corresponding electrical contacts of the adjacent battery cells of the associated cell pair. The bus bar voltage sensor connectors may further have a generally rectangular body having an integral connector terminal with fingers extending from the terminal for crimping an associated voltage sensing wire. Alternatively, the bus bar voltage sensor connectors may have an integral connector terminal pad where an associated voltage sensing wire may be welded. The vehicle may further include a non-conductive housing having a plurality of recesses or compartments configured to receive a corresponding bus bar voltage sensor connector. The housing may include a plurality of resilient tabs configured to secure the corresponding bus bar voltage sensor connector within the compartment while positioning the housing over the battery cells.

Various embodiments according to the present disclosure may include a vehicle having a traction battery with a plurality of battery cells positioned in an array and a non-conductive bus bar housing having a plurality of compartments insulated from one another with each compartment accommodating a bus bar having an integrally formed voltage sense connector for connecting to the terminals of a pair of adjacent battery cells. The housing may include a plurality of retainers positioned on walls of the compartment. The bus bar or cell connector may include a conductive member configured to connect a predetermined number of the plurality of battery cell terminals together. The cell connector may include a voltage sensor connector integrated with the conductive member for connecting an associated voltage sensing lead or wire. The voltage sensing leads or wires are connected to a battery control module.

The plurality of battery cells may be connected in series by the cell connector. The cell connector may include a plurality of fingers for crimping the associated voltage sensing lead and securing the lead to the cell connector. The non-conductive bus bar housing may include resilient retaining tabs cooperating with an associated voltage sensor connector to retain the cell connector within the housing. The compartment of the non-conductive bus bar housing may accommodate two adjacent battery cell terminals, and the cell connector may define two holes within the conductive member to receive the battery cell terminals. The compartment of the non-conductive bus bar housing may also include an associated voltage sensor connector recess to accommodate the associated voltage sensor connector and voltage sensing lead.

Other aspects of the present disclosure relate to a vehicle traction battery cell connector that includes a conductive member configured to connect adjacent cell terminals of a traction battery. The vehicle traction battery cell connector has an integrally formed voltage sense connector extending therefrom and configured to secure a voltage sense wire. The voltage sense connector may include a plurality of claw members configured to secure the voltage sense wire. The voltage sense wire may be welded to the voltage sense connector. The conductive member may define holes for receiving corresponding battery cell terminals of adjacent battery cells. The conductive member may be welded to the adjacent battery cell terminals. The vehicle traction battery cell connector may have a non-conductive housing having a plurality of recesses each configured to receive an associated conductive member. The recesses may have one or more retaining tabs to secure a corresponding vehicle traction battery cell connector.

Embodiments may also include a method for assembling a vehicle traction battery including positioning a plurality of bus bars within associated compartments of a non-conductive bus bar housing, each bus bar having an integrally formed voltage sense connector configured to secure a voltage sense wire, connecting each voltage sense wire to an associated voltage sense connector, positioning the bus bar housing over battery cell terminals, and securing each bus bar to associated adjacent battery cell terminals. In various embodiments, the voltage sense connectors comprise bendable fingers and connecting each voltage sense wire comprises crimping the fingers around an associated voltage sense wire to secure the voltage sense wire to the voltage sense connector. In other embodiments, securing each bus bar comprises welding each bus bar to associated battery terminals. Securing each bus bar may include installing a conductive nut on each battery cell terminal. Connecting each voltage sense wire may include welding the voltage sense wire to the voltage sense connector.

Embodiments according to the present disclosure may provide associated advantages. For example, a bus bar having an integrally formed voltage sense connector reduces part count for a traction battery pack assembly while eliminating an assembly operation and attendant costs.

The above advantages and other advantages and features of the present disclosure will be readily apparent from the following detailed description of the preferred embodiments when taken in connection with the accompanying drawings.

BRIEF DESCRIPTION OF THE DRAWINGS

FIG. 1 is a top plan fragmented view of a representative embodiment of a non-conductive housing having a plurality of recesses that contain a corresponding bus bar voltage sensor connector of the present disclosure;

DETAILED DESCRIPTION

Figure 3:
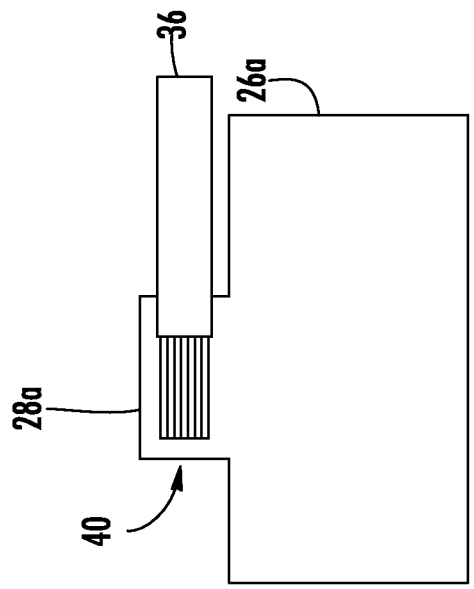
FIG. 3 is a plan view of an alternative embodiment of a bus bar having an integrated voltage sensor connector with a voltage sense wire welded to the bus bar.

As required, detailed embodiments are disclosed herein; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Referring to FIG. 1, a vehicle traction battery cell connector assembly 20 is shown and includes a non-conductive housing 22 with several recessed compartments 24a, 24b, and 24c. Compartments 24a, 24b, and 24c are insulated from one another and configured to receive and retain a corresponding conductive member 26, also referred to as a bus bar. Each compartment may include a plurality of retaining tabs or members that hold a respective conductive member 26a, 26b, and 26c in place during positioning of the assembly over corresponding battery cells. For example, retaining tabs 30a, 30b may cooperate with conductive member 26b to retain conductive member 26b in place during assembly. Depending on the particular application and implementation, conductive members 26 may be positioned within housing 22 prior to positioning housing 22 on corresponding battery cells. Alternatively, housing 22 may be positioned over corresponding battery cell terminals before positioning conductive members 26 within associated compartments or recesses 24a, 24b, 24c within housing 22.

Figure 4:
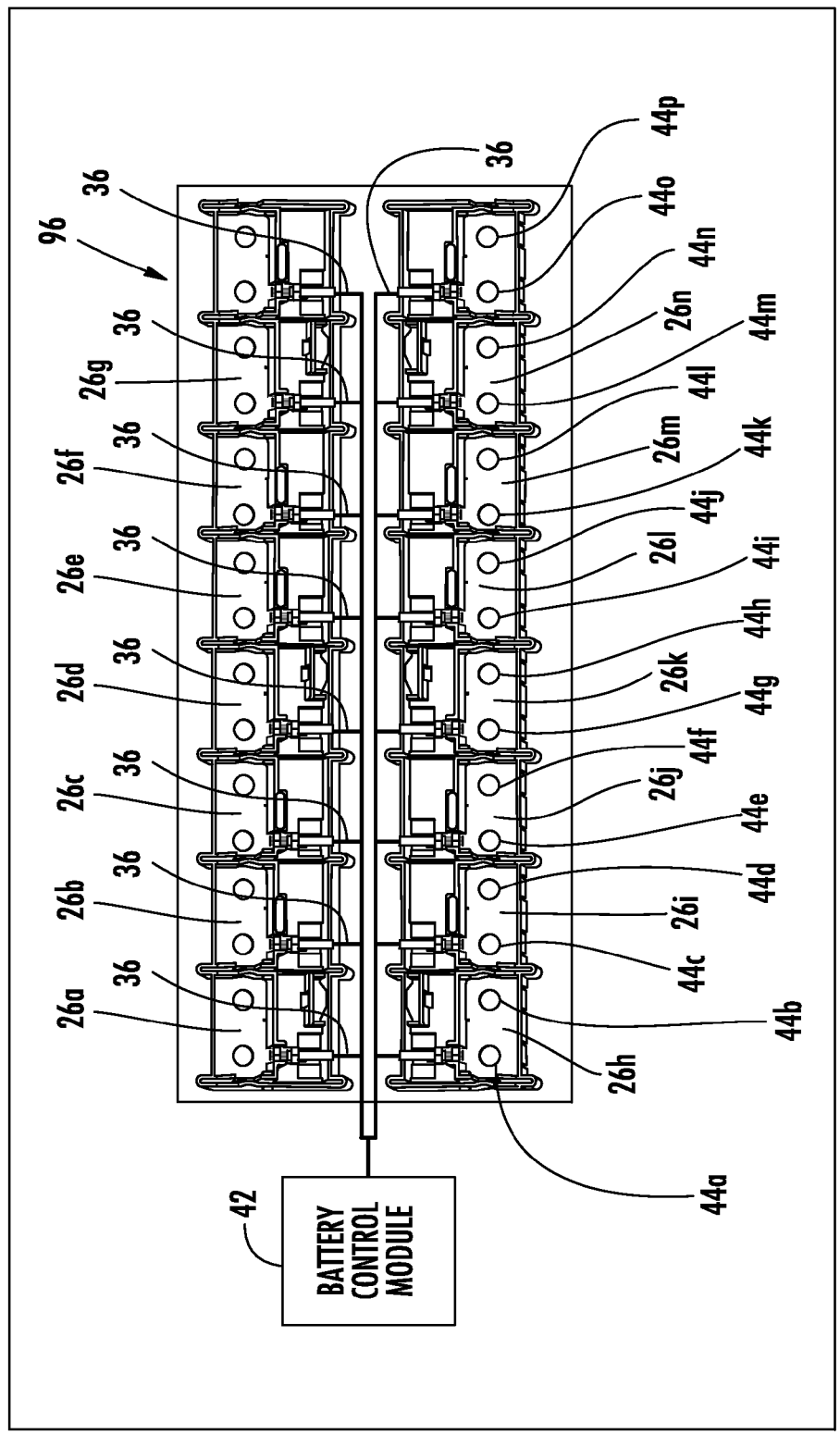
FIG. 4 is a schematic view of a traction battery having adjacent cells connected by bus bars with an integrated voltage sense connector of a representative embodiment according to the present disclosure.
Figure 5:
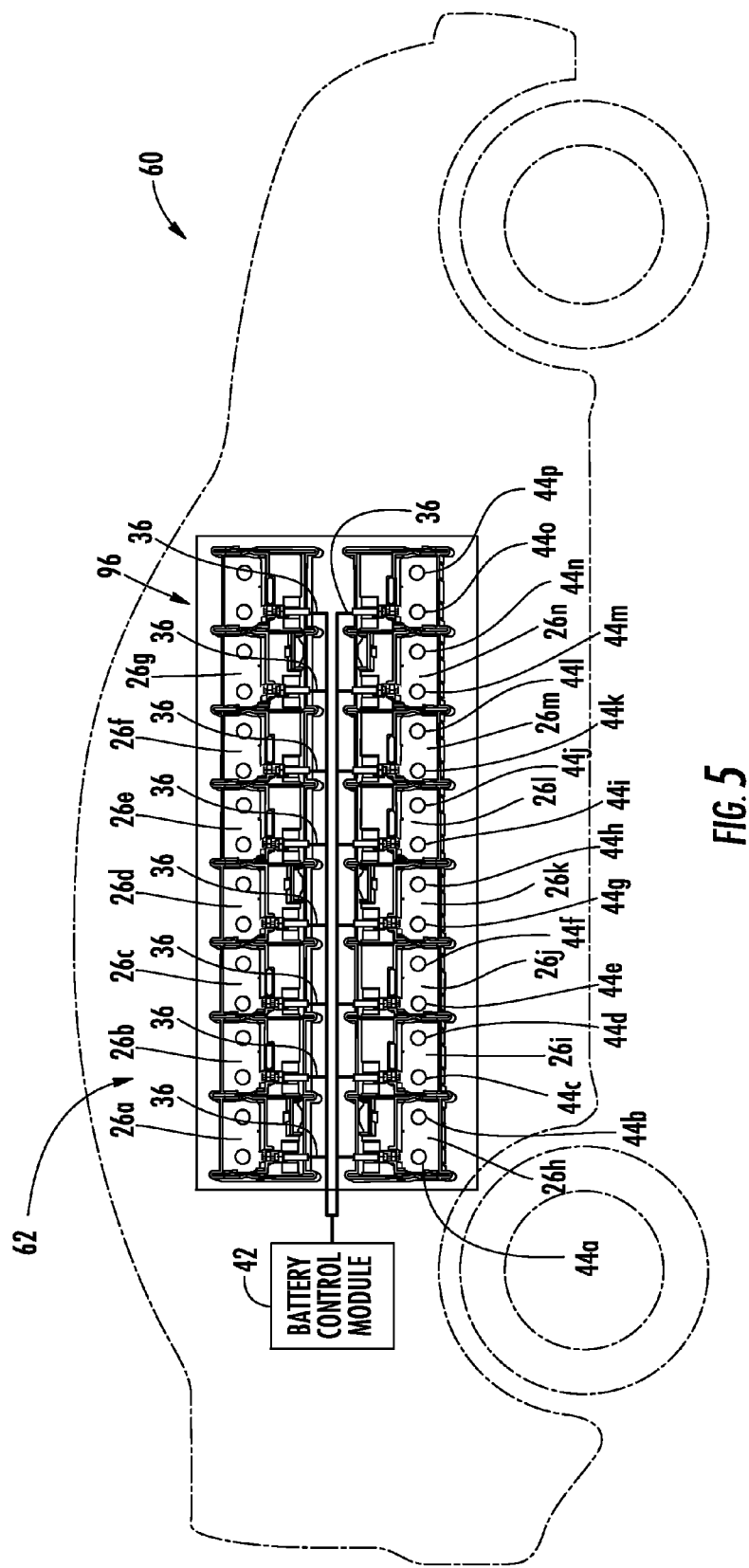
FIG. 5 is a schematic view of a vehicle having a traction battery with a plurality of battery cells positioned in an array with adjacent cells connected by bus bars having integrally formed voltage sense connectors according to one embodiment of the present disclosure.

In the representative embodiment illustrated in FIG. 1, each conductive member or bus bar 26a, 26b, and 26c includes a pair of holes 34 for accommodating corresponding terminals of adjacent battery cells. In this embodiment, each battery cell includes a threaded terminal post that extends through an associated hole 34 with a corresponding conductive member 26 secured by a nut. In some embodiments, conductive members 26 are welded to corresponding battery terminals. The conductive members 26a, 26b, and 26c mechanically and electrically connect adjacent cell terminals of the traction battery. Depending on the number and arrangement of battery cell terminals, a conductive member 26 may be associated with a single battery cell at the end of an array as illustrated in FIGS. 4 and 5, for example. Each conductive member or bus bar 26a, 26b, 26c includes a respective voltage sense connector 28a, 28b, and 28c, which is integrally formed of unitary construction. The voltage sense connectors 28a, 28b, and 28c are configured to secure a voltage sensing wire that provides the corresponding cell voltage to a battery control module (FIG. 4) to monitor the voltage of the connected battery cells as explained in greater detail below. Each compartment 24a, 24b, and 24c may include associated retaining tabs 32a, 32b, 32c that cooperate with respective voltage sense connectors 28a, 28b, and 28c to retain voltage sense connectors 28a, 28b, and 28c within the housing 22. Various embodiments may include resilient retaining tabs.

While the representative embodiment of a conductive member or bus bar illustrated in FIG. 1 is used to connect two adjacent cells, those of ordinary skill in the art will recognize that conductive members 26a, 26b, or 26c may be used to connect a different number of cells. For example, a conductive member having an integrally formed voltage sense connector may be used for a single cell at the end of an array as shown in FIG. 4. Similarly, various types of retainers or complementary geometry for the conductive members 26 and compartments 24 may be used to retain conductive members. The voltage sense connectors 28a, 28b, and 28c are attached to a voltage sensing lead or wire 36.

Figure 2:
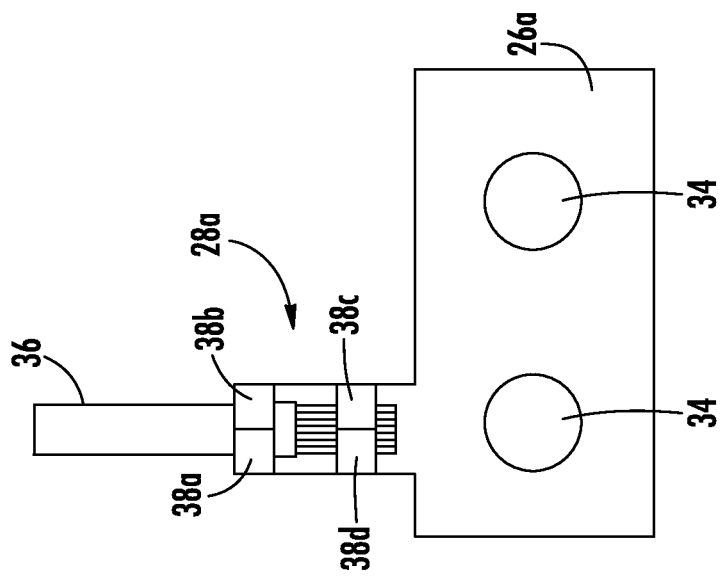
FIG. 2 is a plan view of a conductive member having an integrated voltage sensor connector with a plurality of fingers for crimping a voltage sensing wire according to one embodiment of the present disclosure.

FIG. 2 is a plan view of a conductive member having an integrated voltage sensor connector with a plurality of fingers for crimping a voltage sensing wire according to one embodiment of the present disclosure. As shown in the representative embodiment of FIG. 2, one or more voltage sense connectors 28a, 28b, or 28c have several fingers or claw members 38a-d for crimping the voltage sensing lead 36 and securing the voltage sensing lead 36 to the vehicle traction battery cell connector 26. Members 38a-d are integrally formed of unitary construction with conductive member 26a. As illustrated in the embodiment of FIG. 2, a plurality of prongs, fingers, claws, etc. may be bent to contact the wire insulation, such as members 38a and 38b, to secure wire 36 to conductive member 26a. Members 38c and 38d contact the uninsulated conductive portion of the wire 36. Those of ordinary skill in the art may recognize various mechanical fastening or securing strategies to secure wire 36 and provide electrical contact with voltage sensor connector 28a and/or conductive member 26a.

FIG. 3 is a plan view of an embodiment of a bus bar having an integrated voltage sensor connector with a voltage sense wire welded to the bus bar. In the representative embodiment of FIG. 3, voltage sense connectors 28a, 28b, or 28c are implemented by a terminal pad or extension 40 where a voltage sensing lead 36 may be welded or soldered. Terminal pad 40 is integrally formed of unitary construction with conductive member 26a. As previously described, conductive member 26a may be welded to associated battery cell terminals to electrically connect the cells together. A plurality of voltage sensing lead wires 36 connect associated battery cell(s) to a battery control module 42 (FIG. 4) to obtain a voltage measurement of the battery cells. As previously described, each conductive member 26 may connect a plurality of adjacent battery cells. However, a conductive member having an integrated voltage sense lead may also be used for a single cell depending on the particular battery cell array configuration. In one embodiment, a single cell with a corresponding conductive member 26 and voltage sense connector 28 is provided at each end of an array of battery cells connected in series.

Those of ordinary skill in the art will recognize that features of the embodiments illustrated in FIGS. 2 and 3 may be combined to form other embodiments. For example, the crimping fingers or members 38a-d may be used on a bus bar or conductive member 26a as shown in FIG. 3 configured for welding to associated battery terminals. Likewise, the terminal pad 40 illustrated in FIG. 3 configured for welding or soldering of the voltage sense lead 36 may be integrated into a bus bar or conductive member 26a having holes 34 as illustrated in FIG. 2.

FIGS. 4 and 5 are schematic illustrations of a traction battery having adjacent cells connected by bus bars with integrated voltage sense connectors of a representative embodiment according to the present disclosure. As illustrated in the representative embodiment of FIGS. 4 and 5, a vehicle 60 having a traction battery system 62 with several connected traction battery cells 44a-p connected by the vehicle traction battery cell connector 64 is shown. The connected traction battery cells 44a-p form an array. The battery cells 44a-p may be paired with each pair connected by its respective conductive member 26a-n. As previously described, battery system 62 may include single cells on one or more ends of an array to facilitate connection of the cells in series. As illustrated in FIGS. 4-5, adjacent battery cells 44a and 44b are paired and connected by conductive member 26a, adjacent battery cells 44c and 44d are paired and connected by conductive member 26b, and so on. A voltage sensing leads 36 are attached to respective voltage sense connectors that are integrated with the conductive members 26a-n. The voltage sensing leads 36 are attached to a battery control module 42. The battery control module 42 may include one or more microprocessors configured to conduct voltage sampling of the cells and may process or store the voltages in their respective memories for use in controlling charging and discharging of the battery system 62, cell balancing of individual cells or cell pairs, and similar functions.

Figure 6:
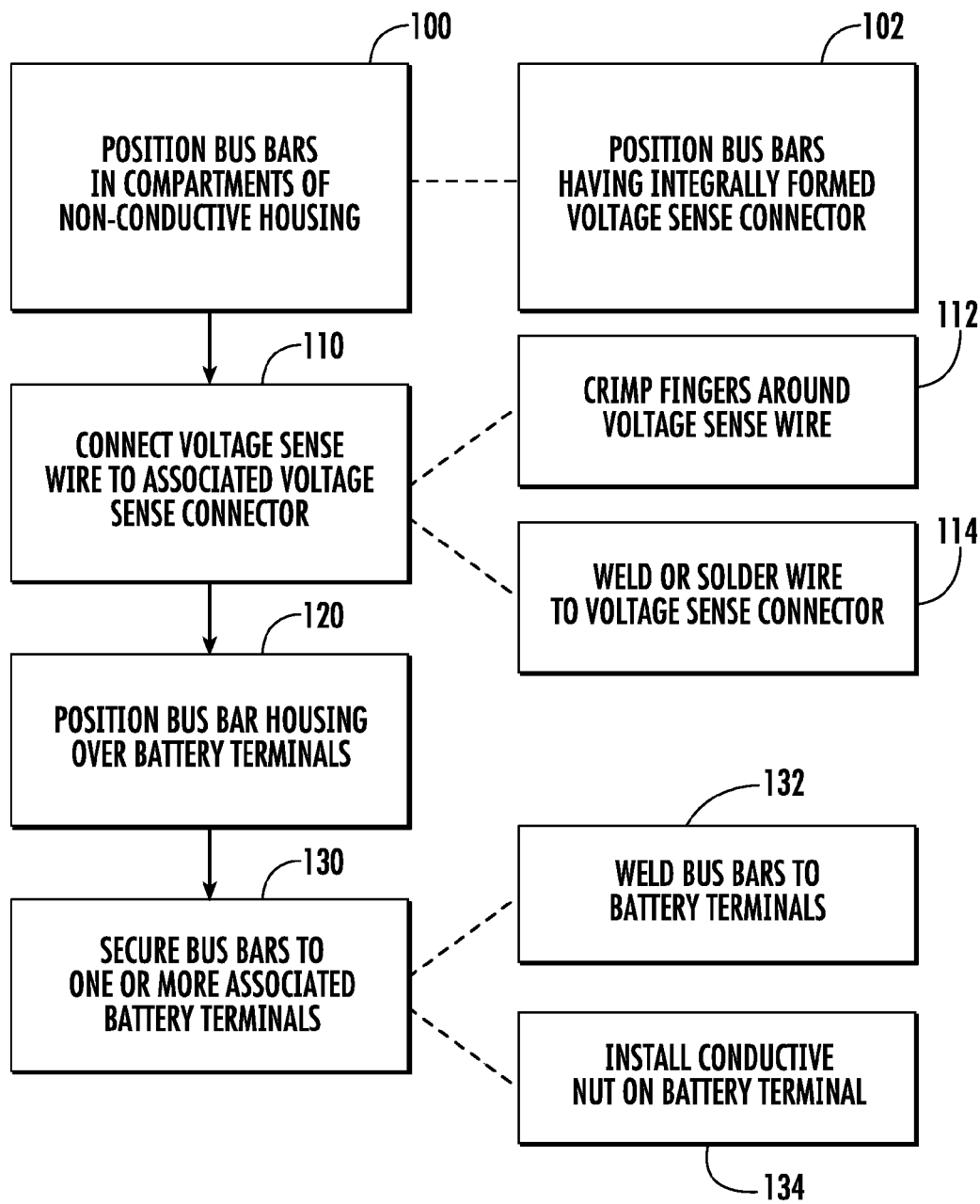
FIG. 6 is a flow chart illustrating a method for assembling a vehicle traction battery according to representative embodiments of the present disclosure.

FIG. 6 is a flow chart illustrating a method for assembling a vehicle traction battery according to representative embodiments of the present disclosure. Those of ordinary skill in the art will recognize that the steps, functions, or processes illustrated in the representative embodiment of FIG. 6 are not necessarily required to be performed in the sequence illustrated. Similarly, not all of the steps or processes illustrated are required to provide various advantages associated with one or more embodiments. Some step, functions, or processes may be performed in a different order, in parallel or simultaneously, or may be omitted in some applications and implementations.

In the representative embodiment illustrated in FIG. 6, a method for assembling a vehicle traction battery includes positioning a plurality of bus bars within associated compartments of a non-conductive bus bar housing as represented by block 100. Each bus bar may include an integrally formed voltage sense connector configured to secure a voltage sense wire as represented by block 102. The method may also include connecting each voltage sense wire to an associated voltage sense connector as represented by block 110. For embodiments having voltage sense connectors with bendable fingers, this may include crimping the fingers around an associated voltage sense wire to secure the voltage sense wire to the voltage sense connector as represented by block 112. For embodiments having connectors without bendable fingers or similar devices, connecting each voltage sense wire to an associated voltage sense connector may include welding or soldering the voltage sense wire to the voltage sense connector as represented by block 114.

Block 120 represents positioning the bus bar housing over battery cell terminals. As previously described, the bus bars may be positioned within the non-conductive housing either before or after positioning the housing over battery cell terminals depending on the particular application and implementation. The method may include securing each bus bar to one or more associated battery cell terminals as represented by block 130. A bus bar with integrated voltage sense connector may be associated with a single battery cell at the end of an array, for example, or associated with two or more battery cells to electrically connect adjacent battery cells. Securing each bus bar to an associated battery cell or cells may include welding each bus bar to associated battery terminals as represented by block 132. Alternatively, securing each bus bar to an associated battery cell or cells may include installing a conductive nut on each battery cell terminal as represented by block 134.

As those of ordinary skill in the art will appreciate, the previously described embodiments according to the present disclosure may provide associated advantages. For example, a bus bar having an integrally formed voltage sense connector reduces part count for a traction battery pack assembly while eliminating an assembly operation and attendant costs. The integrated construction accommodates connection of the bus bar by welding or crimping with embodiments that accommodate welding or mechanical fastening to associated battery terminals.

While one or more embodiments have been illustrated and described, it is not intended that these embodiments illustrate and describe all possible embodiments within the scope of the claims. Rather, the words used in the specification are words of description rather than limitation, and various changes may be made without departing from the spirit and scope of the disclosure. While various embodiments may have been described as providing advantages or being preferred over other embodiments or prior art implementations with respect to one or more desired characteristics, one or more features or characteristics may be compromised to achieve desired overall system attributes, which depend on the specific application and implementation. These attributes include, but are not limited to: cost, strength, durability, life cycle cost, marketability, appearance, packaging, size, serviceability, weight, manufacturability, ease of assembly, etc. The embodiments discussed herein that are described as less desirable than other embodiments or prior art implementations with respect to one or more characteristics are not outside the scope of the disclosure and may be desirable for particular applications.

What is claimed is:

1. A vehicle, comprising:
a plurality of bus bar voltage sensor connectors, each bus bar voltage sensor connector electrically connecting adjacent battery cells of an associated traction battery cell pair and having an integrated voltage sensing lead comprising a plurality of fingers crimped around a voltage sensing wire connected to a battery control module, each connector held within a recess of a non-conductive housing by resilient tabs extending over opposite sides of the sensing lead.

2. The vehicle of claim 1, wherein each bus bar voltage sensor connector defines two holes each cooperating with a corresponding electrical contact of the adjacent battery cells of the associated traction battery cell pair.

3. The vehicle of claim 1, wherein the non-conductive housing further comprises a plurality of resilient tabs configured to secure a generally rectangular body portion of each of the bus bar voltage sensor connectors within the non-conductive housing.

4. The vehicle of claim 1 wherein each of the plurality of bus bar voltage sensor connectors comprises a generally rectangular body having an integral connector terminal extending generally perpendicular to a long side of the generally rectangular body.

* * * * *